(12) United States Patent
Choi et al.

(10) Patent No.: US 10,622,273 B2
(45) Date of Patent: Apr. 14, 2020

(54) SEMICONDUCTOR PACKAGE WITH IMPROVED FLATNESS OF AN INSULATING LAYER FORMED ON PATTERNS

(71) Applicant: SAMSUNG ELECTRONICS CO., LTD., Suwon-si (KR)

(72) Inventors: Joo Young Choi, Suwon-Si (KR); Joon Sung Kim, Suwon-Si (KR); Young Min Kim, Daejeon (KR); Da Hee Kim, Suwon-Si (KR); Tae Wook Kim, Suwon-Si (KR); Byung Ho Kim, Suwon-Si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/006,368

(22) Filed: Jun. 12, 2018

(65) Prior Publication Data

US 2019/0206755 A1 Jul. 4, 2019

(30) Foreign Application Priority Data

Dec. 28, 2017 (KR) ........................ 10-2017-0182059

(51) Int. Cl.
*H01L 23/31* (2006.01)
*H01L 23/498* (2006.01)

(52) U.S. Cl.
CPC ...... *H01L 23/3128* (2013.01); *H01L 23/3157* (2013.01); *H01L 23/49822* (2013.01); *H01L 23/49827* (2013.01)

(58) Field of Classification Search
None
See application file for complete search history.

(56) References Cited

U.S. PATENT DOCUMENTS 5,487,218 A * 1/1996 Bhatt ................ H01L 23/5384
29/852
5,759,906 A 6/1998 Lou
(Continued)

FOREIGN PATENT DOCUMENTS

JP 2004-179545 A 6/2004
JP 2015-222753 A 12/2015
(Continued)

OTHER PUBLICATIONS

Office Action dated Mar. 15, 2019, issued in corresponding Korean Patent Application No. 10-2017-0182059.
(Continued)

*Primary Examiner* — Bilkis Jahan
(74) *Attorney, Agent, or Firm* — Sughrue Mion, PLLC

(57) ABSTRACT

A semiconductor package includes a support member having first and second surfaces, having a cavity, and including a wiring structure, a semiconductor chip having connection pads, a connection member including a first insulating layer, a first redistribution layer on the first insulating layer, and a plurality of first vias connecting the wiring structure and the connection pads to the first redistribution layer and an encapsulant encapsulating the semiconductor chip, The wiring structure includes wiring patterns disposed on the second surface of the support member, and the first insulating layer includes a first insulating coating covering the wiring patterns and a second insulating coating disposed on the first insulating coating and having a higher level of flatness than that of the first insulating coating.

11 Claims, 12 Drawing Sheets

(56) References Cited

U.S. PATENT DOCUMENTS

| | | | |
|---|---|---|---|
| 8,198,541 B2* | 6/2012 | Sasaoka | H05K 1/0206 |
| | | | 174/252 |
| 9,420,695 B2* | 8/2016 | Su | H05K 1/188 |
| 9,426,891 B2* | 8/2016 | Tsai | H05K 1/186 |
| 9,570,400 B2* | 2/2017 | Baek | H01L 23/14 |
| 2004/0145858 A1 | 7/2004 | Sakurada | |
| 2005/0127492 A1* | 6/2005 | Howard | H01L 23/13 |
| | | | 257/691 |
| 2006/0272854 A1* | 12/2006 | Yamano | H01L 23/3677 |
| | | | 174/264 |
| 2009/0215231 A1* | 8/2009 | Inoue | H01L 24/19 |
| | | | 438/125 |
| 2015/0342039 A1 | 11/2015 | Wu | |
| 2016/0254143 A1 | 9/2016 | Hanawa et al. | |
| 2017/0133309 A1 | 5/2017 | Kim et al. | |
| 2017/0278766 A1 | 9/2017 | Kim et al. | |

FOREIGN PATENT DOCUMENTS

| | | | |
|---|---|---|---|
| KR | 10-2004-0044342 A | 5/2004 |
| KR | 10-2017-0112906 A | 10/2017 |

OTHER PUBLICATIONS

Communication dated Sep. 12, 2019, issued by the Taiwanese Intellectual Property Office in counterpart Taiwanese Application No. 107119360.

Communication dated Jul. 1, 2019, issued by the Korean Intellectual Property Office in counterpart Korean Patent Application No. 10-2017-0182059.

\* cited by examiner

SEMICONDUCTOR PACKAGE WITH IMPROVED FLATNESS OF AN INSULATING LAYER FORMED ON PATTERNS

CROSS-REFERENCE TO RELATED APPLICATION(S)

This application claims the benefit of priority to Korean Patent Application No. 10-2017-0182059, filed on Dec. 28, 2017 in the Korean Intellectual Property Office, the disclosure of which is incorporated herein by reference in its entirety.

BACKGROUND

1. Field

The present disclosure relates to a semiconductor package.

2. Description of Related Art

Semiconductor packages have been continuously required to be thinned and lightened in terms of a shape, and have been required to be implemented in a system in package (SiP) form requiring complexation and multi-functionality in terms of a function. In accordance with such a development trend, a fan-out wafer level package (FOWLP) has been recently prominent, and attempts to satisfy requirements of semiconductor packaging by applying several techniques to the FOWLP have been conducted.

One type of package technology suggested to satisfy the technical demand as described above is a fan-out semiconductor package. Such a fan-out semiconductor package has a compact size and may allow a plurality of pins to be implemented by redistributing connection terminals outwardly of a region in which a semiconductor chip is disposed.

SUMMARY

An aspect of the present disclosure may provide a semiconductor package in which a short-circuit of an interlayer circuit may be prevented by improving flatness of an insulating layer formed on patterns.

According to an aspect of the present disclosure, a semiconductor package may be provided, in which an insulating layer provided on patterns (particularly, wiring patterns protruding from a support member) are formed by double coating to improve final flatness of the insulating layer.

According to an aspect of the present disclosure, a semiconductor package may include: a support member having first and second surfaces opposing each other, having a cavity penetrating through the first and second surfaces, and including a wiring structure; a semiconductor chip disposed in the cavity and having an active surface having connection pads disposed thereon; a connection member including a first insulating layer disposed on the second surface of the support member, a first redistribution layer disposed on the first insulating layer, and a plurality of first vias penetrating through each of the first insulating layer and connecting the wiring structure and the connection pads to the first redistribution layer; and an encapsulant encapsulating the semiconductor chip disposed in the cavity and covering the first surface of the support member, wherein the wiring structure includes wiring patterns protruding from or concavely disposed in the second surface of the support member, and the first insulating layer includes a first insulating coating disposed on the second surface of the support member and covering the wiring patterns and a second insulating coating disposed on the first insulating coating and having a higher level of flatness than that of the first insulating coating.

According to another aspect of the present disclosure, a semiconductor package may include: a semiconductor chip having an active surface having connection pads disposed thereon; a connection member including a first insulating layer disposed on the active surface of the semiconductor chip, a first redistribution layer disposed on the first insulating layer, first vias penetrating through the first insulating layer and electrically connecting the connection pads and the first redistribution layer to each other, and a second insulating layer disposed on the first insulating layer and covering the first redistribution layer; and an encapsulant disposed on the connection member and encapsulating the semiconductor chip, wherein the second insulating layer includes a first insulating coating disposed on the first insulating layer and covering the first redistribution layer and a second insulating coating disposed on the first insulating coating and having a higher level of flatness than that of the first insulating coating, and the first and second insulating coatings are formed of the same material.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, exemplary embodiments in the present disclosure will be described with reference to the accompanying drawings. In the accompanying drawings, shapes, sizes, and the like, of components may be exaggerated or shortened for clarity.

Herein, a lower side, a lower portion, a lower surface, and the like, are used to refer to a direction toward a mounting surface of the fan-out semiconductor package in relation to cross sections of the drawings, while an upper side, an upper portion, an upper surface, and the like, are used to refer to an opposite direction to the direction. However, these directions are defined for convenience of explanation, and the claims are not particularly limited by the directions defined as described above.

The meaning of a "connection" of a component to another component in the description includes an indirect connection through an adhesive layer as well as a direct connection between two components. In addition, "electrically connected" conceptually includes a physical connection and a physical disconnection. In addition, representations such as "first", "second", and the like, are used to distinguish one component from another component, and does not limit a sequence, importance, and the like, of the corresponding components. In some cases, a first element may be referred to as a second element without departing from the scope of the claims set forth herein. Similarly, a second element may also be referred to as a first element.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part one with one another. For example, one element described in a particular exemplary embodiment, even if it is not described in another exemplary embodiment, may be understood as a description related to another exemplary embodiment, unless an opposite or contradictory description is provided therein.

Terms used herein are used only in order to describe an exemplary embodiment rather than limiting the present disclosure. In this case, singular forms include plural forms unless interpreted otherwise in context.

Electronic Device

Figure 1:
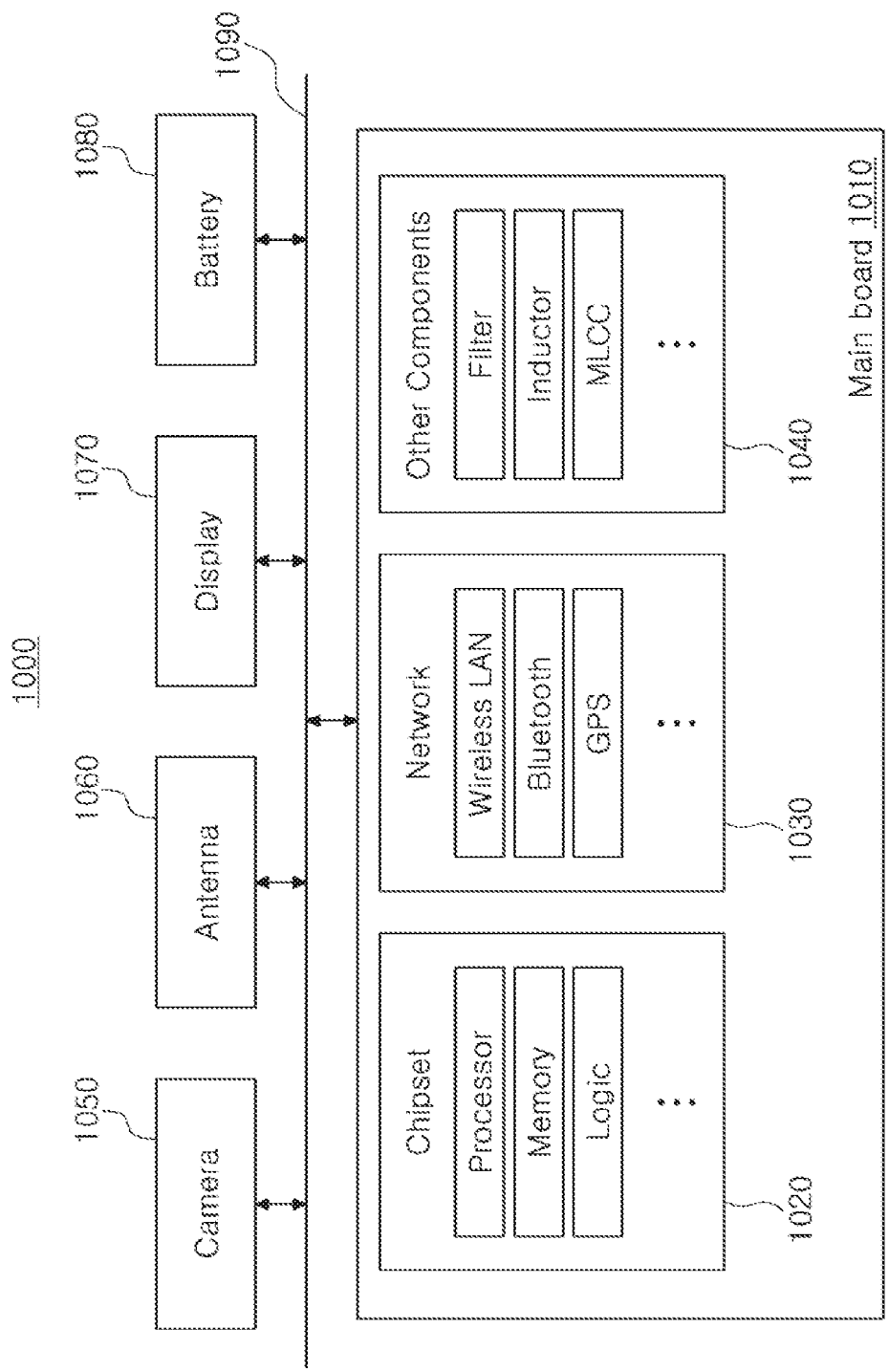
FIG. 1 is a schematic block diagram illustrating an example of an electronic device system.

FIG. 1 is a schematic block diagram illustrating an example of an electronic device system.

Referring to FIG. 1, an electronic device 1000 may accommodate a mainboard 1010 therein. The mainboard 1010 may include chip-related components 1020, network-related components 1030, other components 1040, and the like, physically or electrically connected thereto. These components may be connected to others to be described below to form various signal lines 1090.

The chip-related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip-related components 1020 are not limited thereto, but may also include other types of chip related components. In addition, the chip-related components 1020 may be combined with each other.

The network-related components 1030 may include protocols such as wireless fidelity (Wi-Fi) (Institute of Electrical And Electronics Engineers (IEEE) 802.11 family, or the like), worldwide interoperability for microwave access (Wi-MAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network-related components 1030 are not limited thereto, but may also include a variety of other wireless or wired standards or protocols. In addition, the network-related components 1030 may be combined with each other, together with the chip-related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip-related components 1020 or the network-related components 1030 described above.

Depending on a type of the electronic device 1000, the electronic device 1000 may include other components that may or may not be physically or electrically connected to the mainboard 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
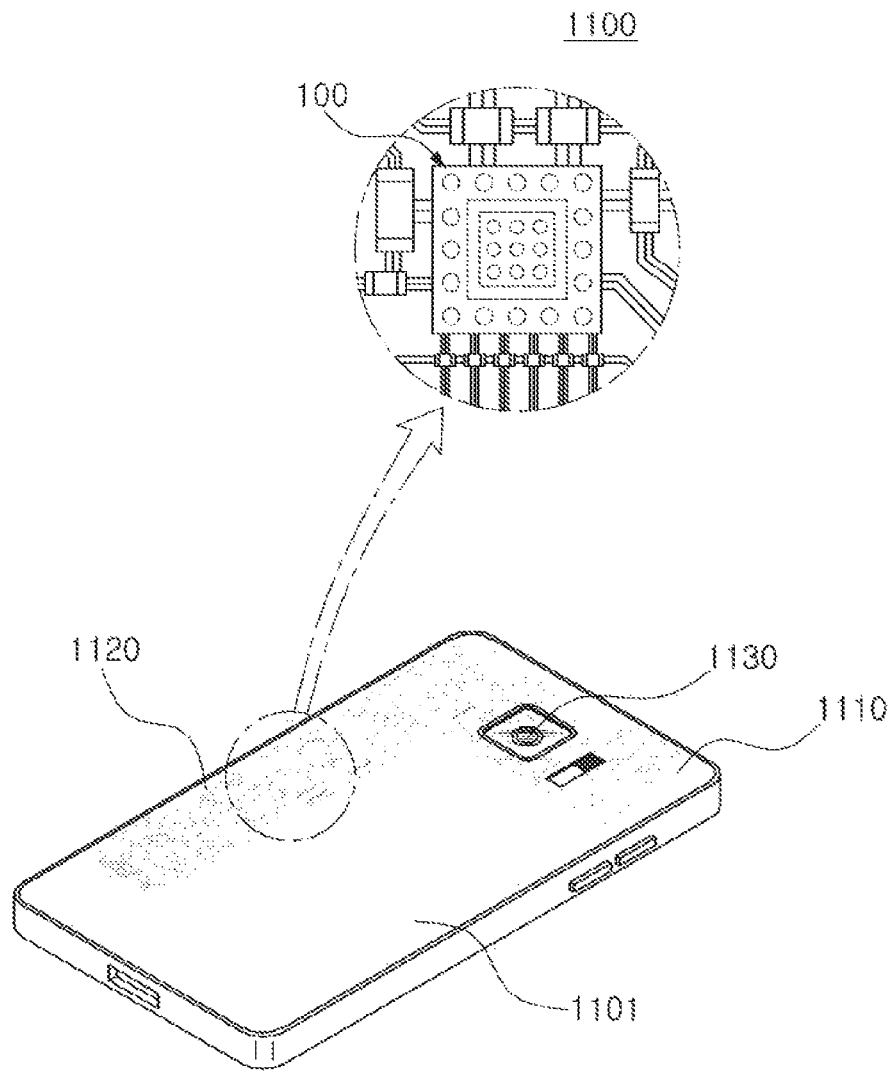
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a motherboard 1110 may be accommodated in a body 1101 of a smartphone 1100, and various electronic components 1120 may be physically or electrically connected to the motherboard 1110. In addition, other components that may or may not be physically or electrically connected to the mainboard 1010, such as a camera module 1130, may be accommodated in the body 1101. Some of the electronic components 1120 may be the chip-related components, and the semiconductor package 100 may be, for example, an application processor among the chip related components, but is not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a semiconductor finished product in oneself, and may be damaged due to external physical or chemical impact. Therefore, the semiconductor chip is not used in an exposed state, but rather is packaged and used in an electronic device, or the like, in a package state.

Semiconductor packaging is required because there is a difference in a circuit width between the semiconductor chip and a mainboard of the electronic device in terms of electrical connection. In detail, a size of connection pads of the semiconductor chip and an interval between the connection pads of the semiconductor chip are very fine, but a size of component mounting pads of the mainboard used in the electronic device and an interval between the component mounting pads of the mainboard are significantly larger than those of the semiconductor chip. Therefore, it may be difficult to directly mount the semiconductor chip on the mainboard, and packaging technology for buffering a difference in a circuit width between the semiconductor and the mainboard is required.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the accompanying drawings.

Fan-in Semiconductor Package

Figure 3:
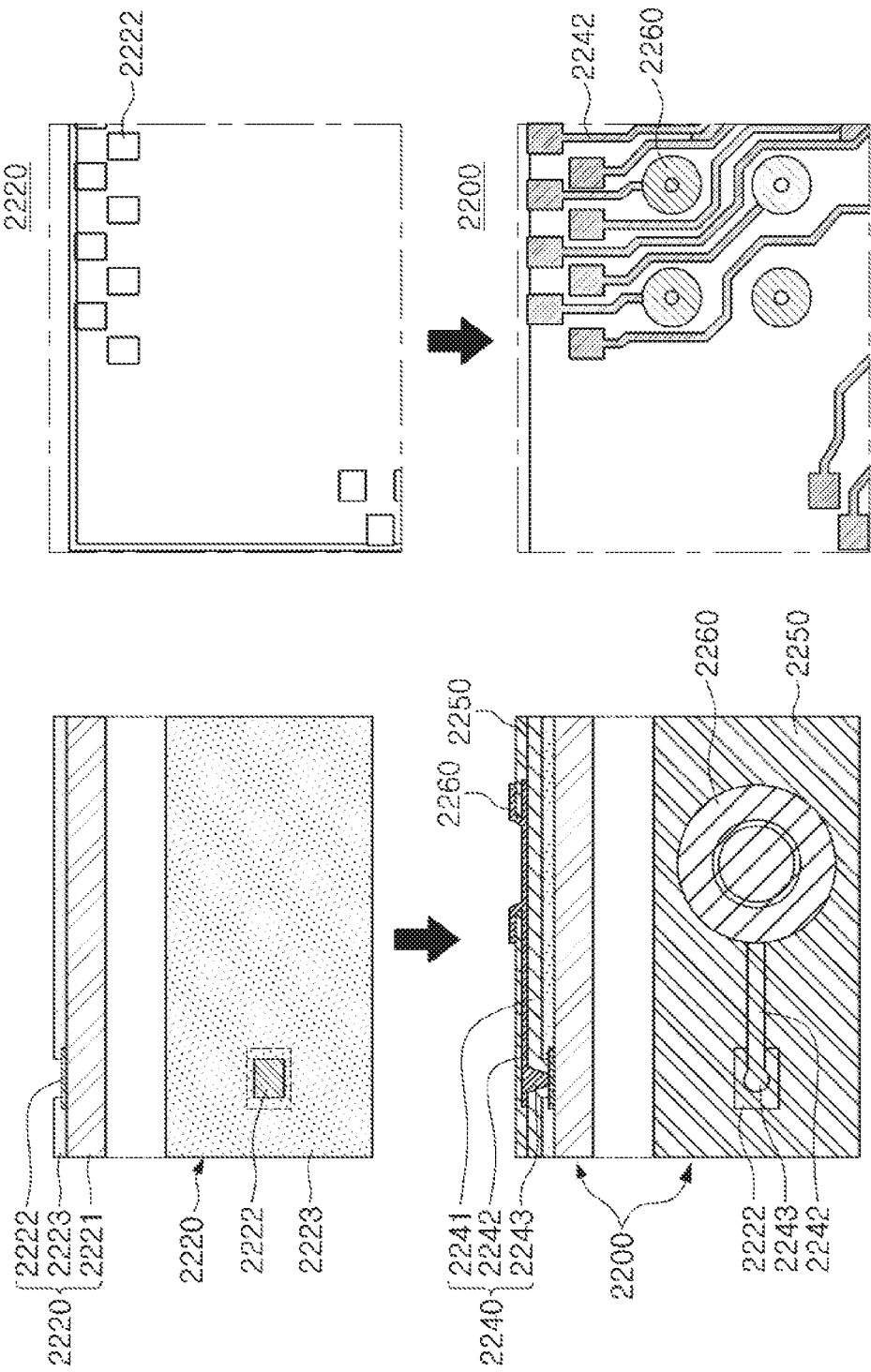
FIGS. 3A and 3B are schematic cross-sectional views illustrating states of a fan-in semiconductor package before and after being packaged.
Figure 4:
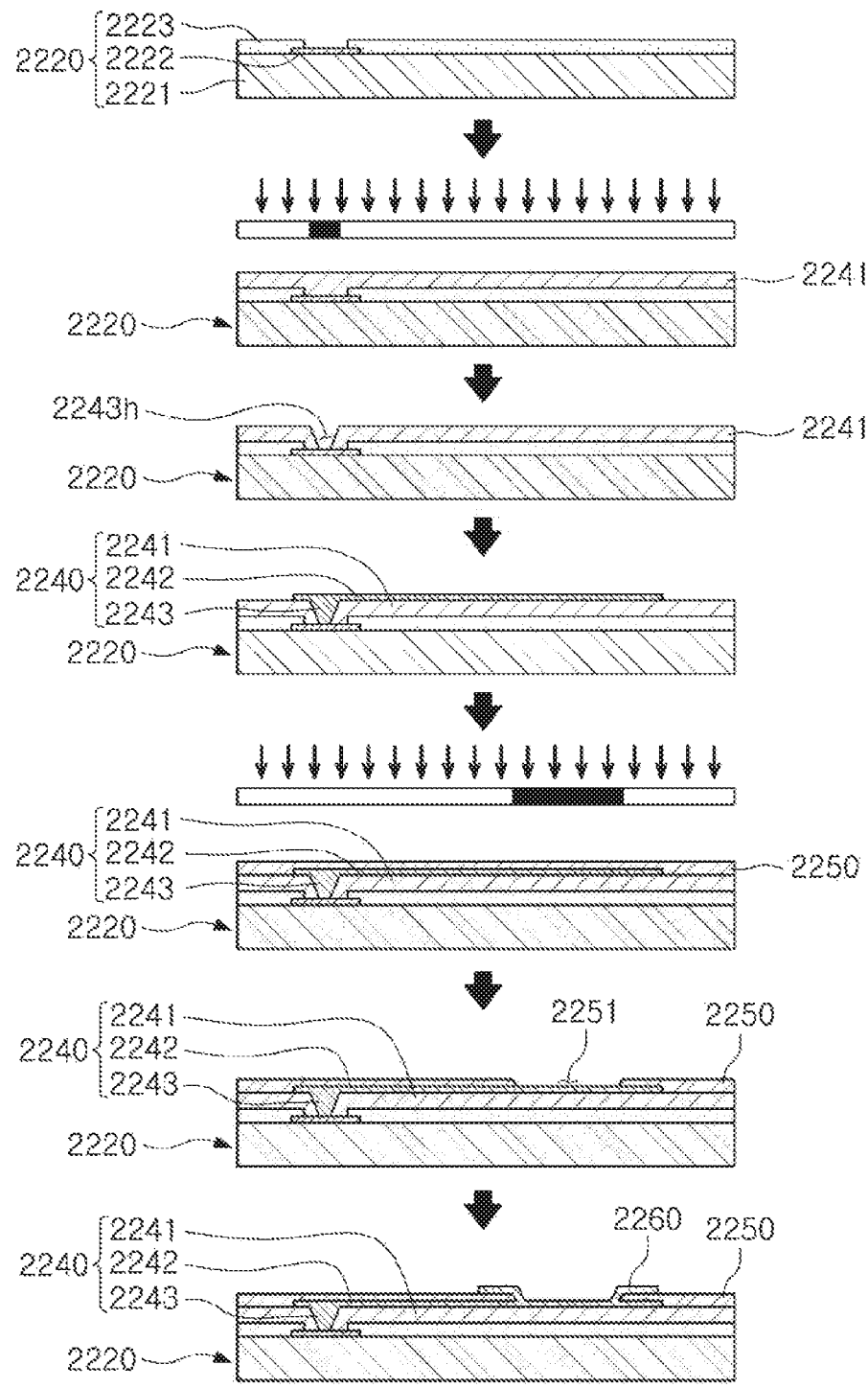
FIG. 4 is schematic cross-sectional views illustrating a packaging process of a fan-in semiconductor package.

FIGS. 3A and 3B are schematic cross-sectional views illustrating states of a fan-in semiconductor package before and after being packaged, and FIG. 4 is schematic cross-sectional views illustrating a packaging process of a fan-in semiconductor package.

Referring to FIGS. 3 and 4, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide film, a nitride film, or the like, formed on one surface of the body 2221 and covering at least portions of the connection pads 2222. In this case, since the connection pads 2222 may be significantly small, it may be difficult to mount the integrated circuit (IC) on an intermediate level printed circuit board (PCB) as well as on the mainboard of the electronic device, or the like.

Therefore, a connection member 2240 may be formed depending on a size of the semiconductor chip 2220 on the semiconductor chip 2220 in order to redistribute the connection pads 2222. The connection member 2240 may be formed by forming an insulating layer 2241 on the semiconductor chip 2220 using an insulating material such as a photoimagable dielectric (PID) resin, forming via holes 2243h opening the connection pads 2222, and then forming wiring patterns 2242 and vias 2243. Then, a passivation layer 2250 protecting the connection member 2240 may be formed, an opening 2251 may be formed, and an underbump metal layer 2260, or the like, may be formed. That is, a fan-in semiconductor package 2200 including, for example, the semiconductor chip 2220, the connection member 2240, the passivation layer 2250, and the underbump metal layer 2260 may be manufactured through a series of processes.

As described above, the fan-in semiconductor package may have a package form in which all of the connection pads, for example, input/output (I/O) terminals, of the semiconductor chip are disposed inside the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has significant spatial limitations. Therefore, it is difficult to apply this structure to a semiconductor chip having a large number of I/O terminals or a semiconductor chip having a small size. In addition, due to the disadvantage described above, the fan-in semiconductor package may not be directly mounted and used on the mainboard of the electronic device. The reason is that even in the case in which a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip may not be sufficient to directly mount the fan-in semiconductor package on the mainboard of the electronic device.

Figure 5:
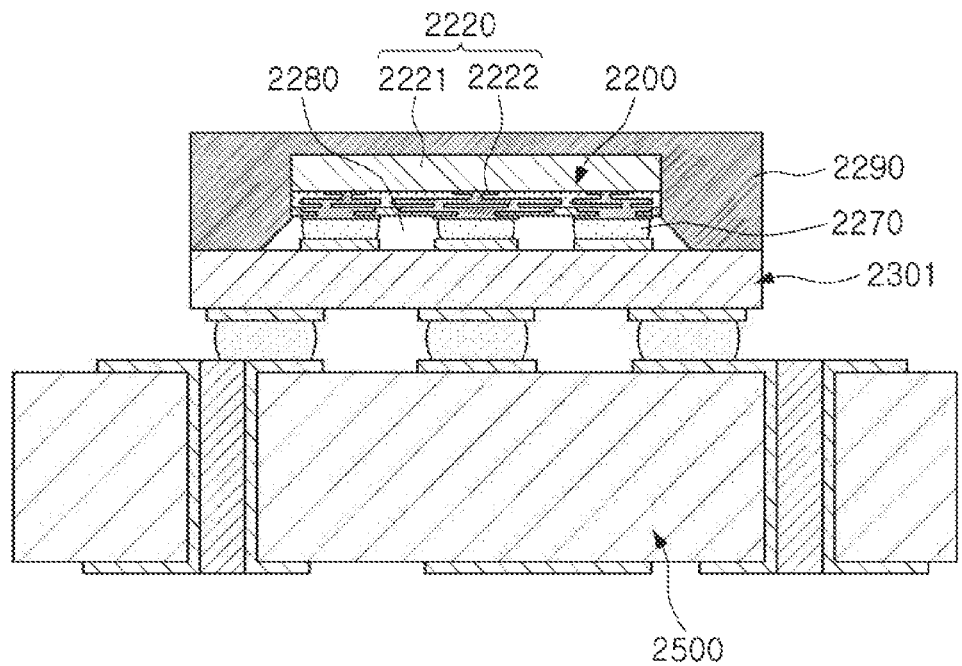
FIG. 5 is a schematic cross-sectional view illustrating a case in which a fan-in semiconductor package is mounted on an interposer substrate and is ultimately mounted on a mainboard of an electronic device.
Figure 6:
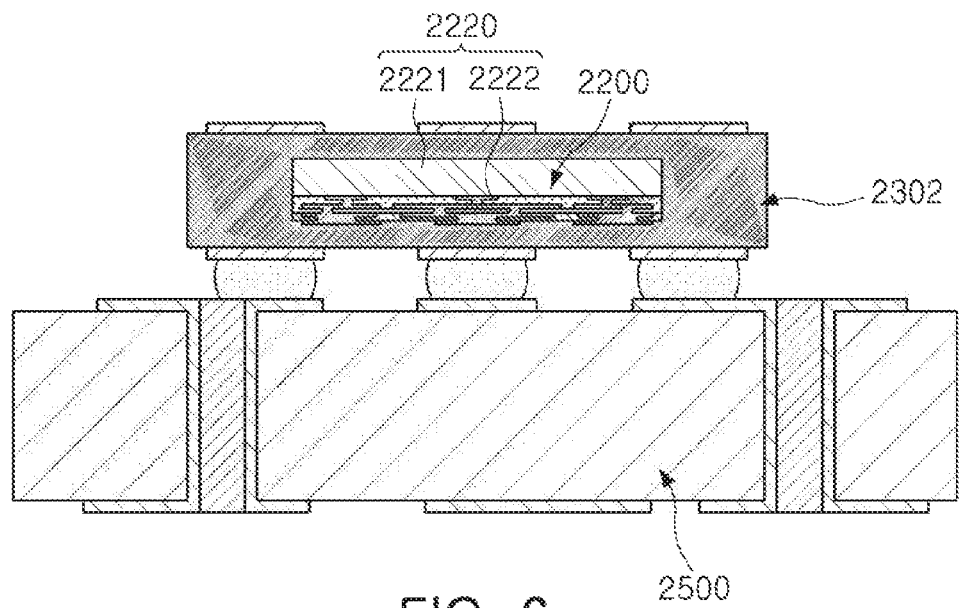
FIG. 6 is a schematic cross-sectional view illustrating a case in which a fan-in semiconductor package is embedded in an interposer substrate and is ultimately mounted on a mainboard of an electronic device.

FIG. 5 is a schematic cross-sectional view illustrating a case in which a fan-in semiconductor package is mounted on an interposer substrate and is ultimately mounted on a mainboard of an electronic device, and FIG. 6 is a schematic cross-sectional view illustrating a case in which a fan-in semiconductor package is embedded in an interposer substrate and is ultimately mounted on a mainboard of an electronic device.

Referring to FIGS. 5 and 6, in a fan-in semiconductor package 2200, connection pads 2222, that is, I/O terminals, of a semiconductor chip 2220 may be redistributed once more through an interposer substrate 2301, and the fan-in semiconductor package 2200 may be ultimately mounted on a mainboard 2500 of an electronic device in a state in which it is mounted on the interposer substrate 2301. In this case, low melting point metal balls 2270, and the like, may be fixed by an underfill resin 2280, or the like, and an outer side of the semiconductor chip 2220 may be covered with an encapsulant 2290, or the like. Alternatively, a fan-in semiconductor package 2200 may be embedded in a separate interposer substrate 2302, connection pads 2222, that is, I/O terminals, of a semiconductor chip 2220 may be redistributed once more by the interposer substrate 2302 in a state in which the fan-in semiconductor package 2200 is embedded in the interposer substrate 2302, and the fan-in semiconductor package 2200 may be ultimately mounted on a mainboard 2500 of an electronic device.

As described above, it may be difficult to directly mount and use the fan-in semiconductor package on the mainboard of the electronic device. Therefore, the fan-in semiconductor package may be mounted on the separate interposer substrate and be then mounted on the mainboard of the electronic device through a packaging process or may be mounted and used on the mainboard of the electronic device in a state in which it is embedded in the interposer substrate.

Fan-Out Semiconductor Package

Figure 7:
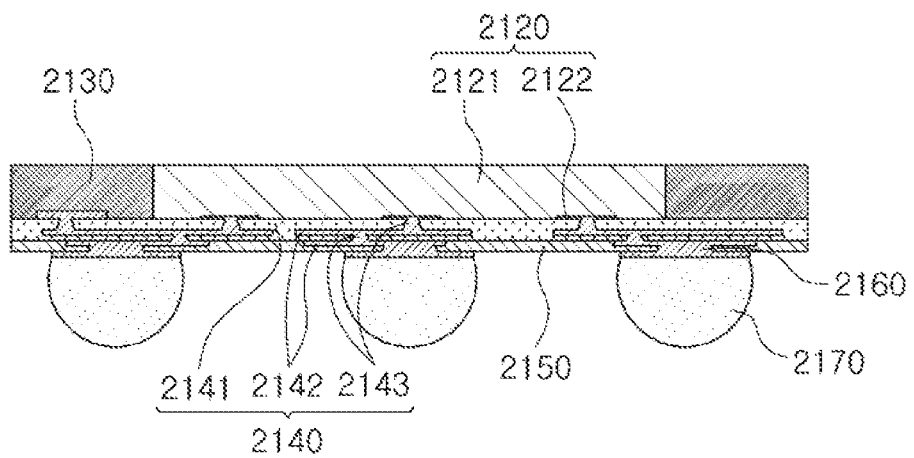
FIG. 7 is a schematic cross-sectional view illustrating a fan-out semiconductor package.

FIG. 7 is a schematic cross-sectional view illustrating a fan-out semiconductor package.

Referring to FIG. 7, in a fan-out semiconductor package 2100, for example, an outer side of a semiconductor chip 2120 may be protected by an encapsulant 2130, and connection pads 2122 of the semiconductor chip 2120 may be redistributed outwardly of the semiconductor chip 2120 by a connection member 2140. In this case, a passivation layer 2150 may further be formed on the connection member 2140, and an underbump metal layer 2160 may further be formed in openings of the passivation layer 2150. Low melting point metal balls 2170 may further be formed on the underbump metal layer 2160. The semiconductor chip 2120 may be an integrated circuit (IC) including a body 2121, the connection pads 2122, a passivation layer (not illustrated), and the like. The connection member 2140 may include an insulating layer 2141, redistribution layers 2142 formed on the insulating layer 2141, and vias 2143 electrically connecting the connection pads 2122 and the redistribution layers 2142 to each other.

In the present manufacturing process, the connection member 2140 may be formed after the encapsulant 2130 is formed outside the semiconductor chip 2120. In this case, a process for the connection member 2140 is performed from the via connecting the redistribution layers and the connection pads 2122 of the semiconductor chip 2120 to each other and the redistribution layers, and the vias 2143 may thus have a width that becomes small as they approach the semiconductor chip (see an enlarged region).

As described above, the fan-out semiconductor package may have a form in which I/O terminals of the semiconductor chip are redistributed and disposed outwardly of the semiconductor chip through the connection member formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection member formed on the semiconductor chip as described above. Therefore, even in the case in which a size of the semiconductor chip is decreased, a standardized ball layout may be used in the fan-out semiconductor package as it is, such that the fan-out semiconductor package may be mounted on the mainboard of the electronic device without using a separate interposer substrate, as described below.

Figure 8:
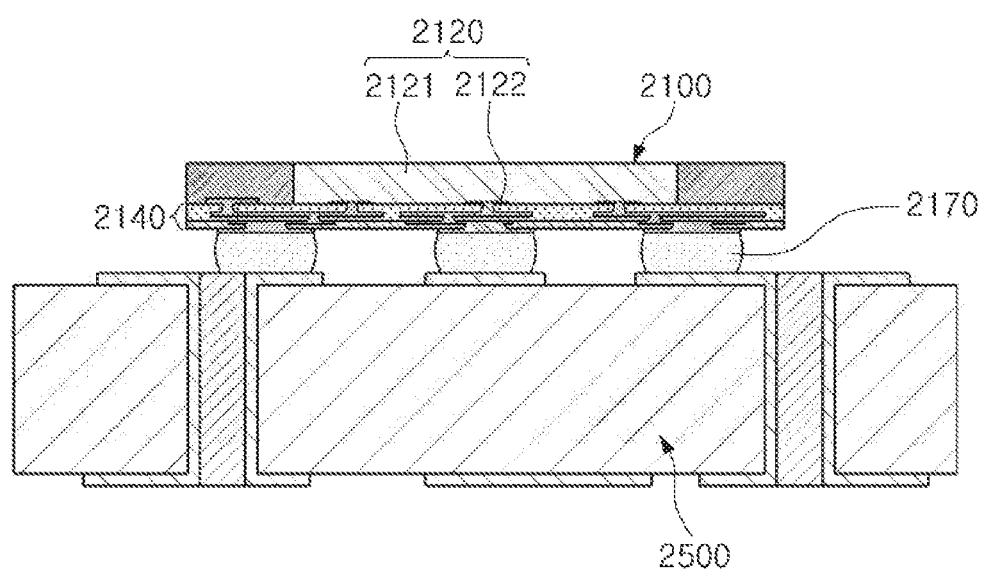
FIG. 8 is a schematic cross-sectional view illustrating a case in which a fan-out semiconductor package is mounted on a mainboard of an electronic device.

FIG. 8 is a schematic cross-sectional view illustrating a case in which a fan-out semiconductor package is mounted on a mainboard of an electronic device.

Referring to FIG. 8, a fan-out semiconductor package 2100 may be mounted on a mainboard 2500 of an electronic device through low melting point metal balls 2170, or the like. That is, as described above, the fan-out semiconductor package 2100 includes the connection member 2140 formed on the semiconductor chip 2120 and capable of redistributing the connection pads 2122 to a fan-out region that is outside of a size of the semiconductor chip 2120, such that the standardized ball layout may be used in the fan-out semiconductor package 2100 as it is. As a result, the fan-out semiconductor package 2100 may be mounted on the mainboard 2500 of the electronic device without using a separate interposer substrate, or the like.

As described above, since the fan-out semiconductor package may be mounted on the mainboard of the electronic device without using the separate interposer substrate, the fan-out semiconductor package may be implemented at a thickness lower than that of the fan-in semiconductor package using the interposer substrate. Therefore, the fan-out semiconductor package may be miniaturized and thinned. In addition, the fan-out semiconductor package has excellent thermal characteristics and electrical characteristics, such that it is particularly appropriate for a mobile product. Therefore, the fan-out semiconductor package may be implemented in a form more compact than that of a general package-on-package (POP) type using a printed circuit board (PCB), and may solve a problem due to the occurrence of a warpage phenomenon.

Meanwhile, the fan-out semiconductor package refers to package technology for mounting the semiconductor chip on the mainboard of the electronic device, or the like, as described above, and protecting the semiconductor chip from external impacts, and is a concept different from that of a printed circuit board (PCB) such as an interposer substrate, or the like, having a scale, a purpose, and the like, different from those of the fan-out semiconductor package, and having the fan-in semiconductor package embedded therein.

A semiconductor package in which a resin for an insulating layer may be smoothly applied even though patterns of a redistribution layer are implemented at a fine pitch will hereinafter be described in detail with reference to the accompanying drawings.

Figure 9:
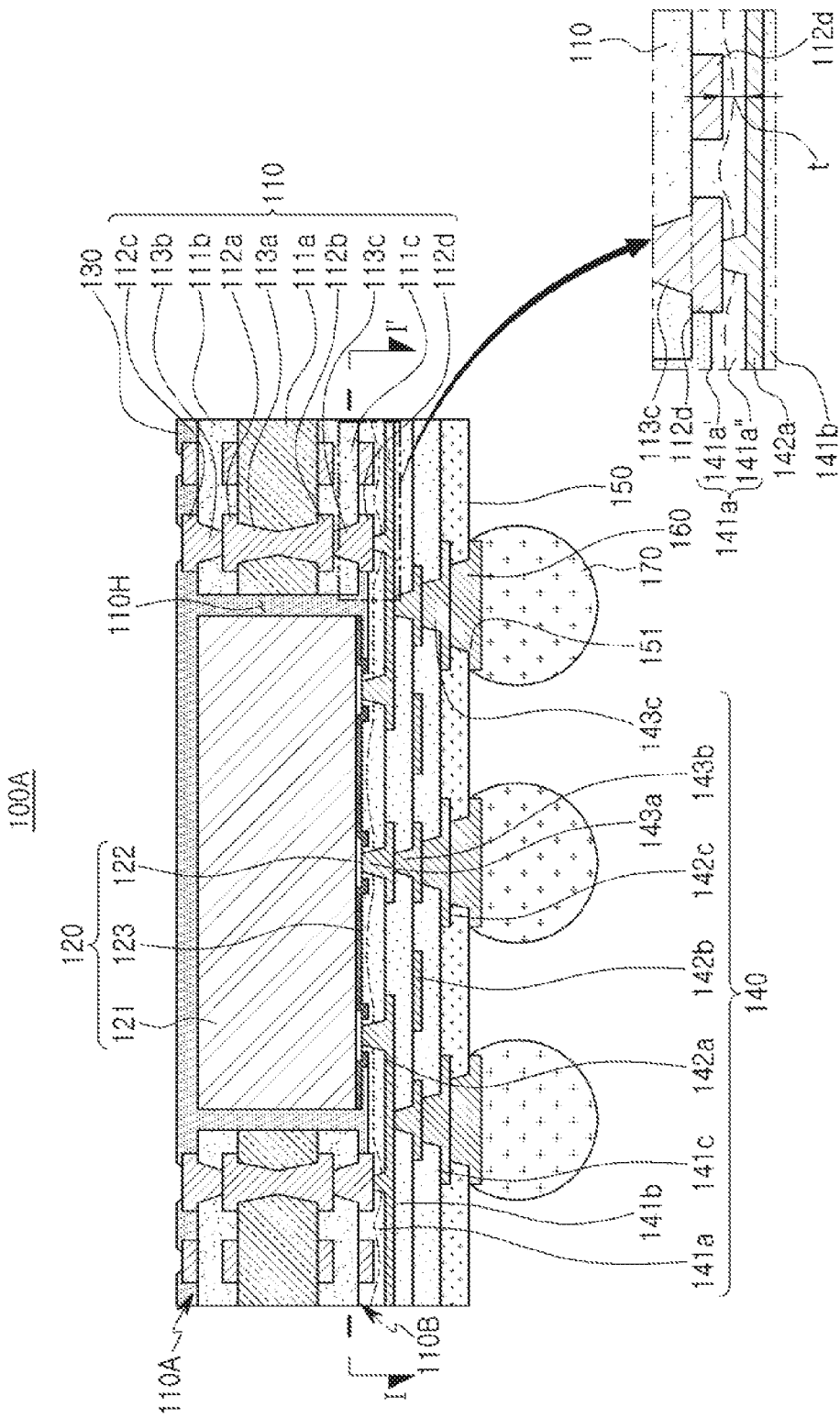
FIG. 9 is a side cross-sectional view illustrating a semiconductor package according to an exemplary embodiment in the present disclosure.
Figure 10:
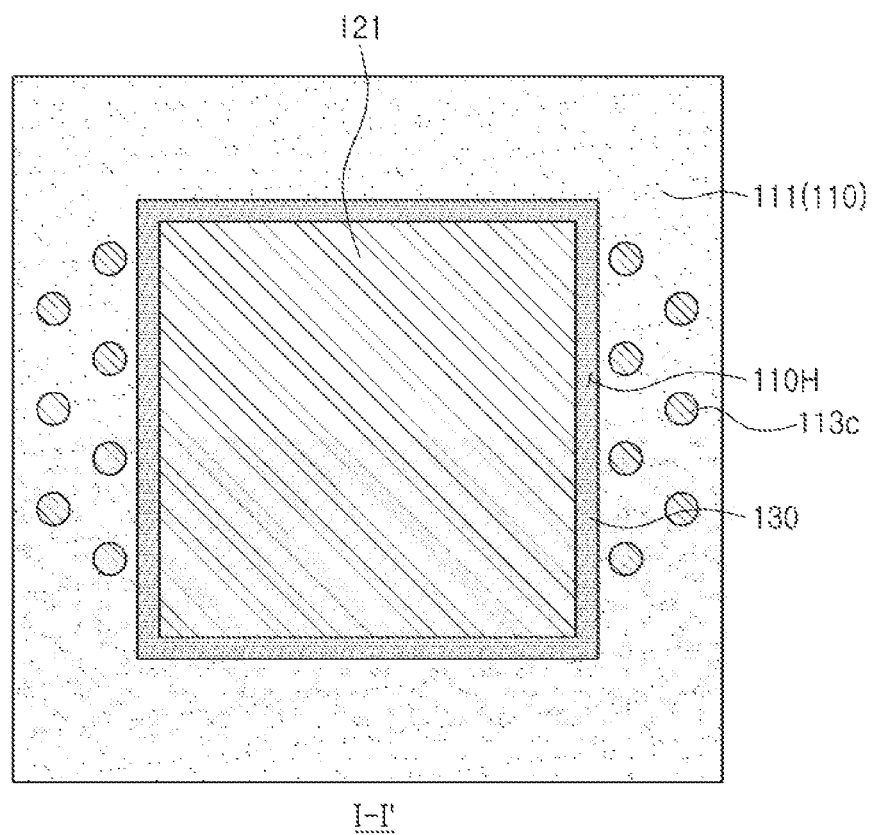
FIG. 10 is a plan view illustrating the semiconductor package illustrated in FIG. 9.

FIG. 9 is a side cross-sectional view illustrating a semiconductor package according to an exemplary embodiment in the present disclosure. FIG. 10 is a plan view illustrating the semiconductor package illustrated in FIG. 9.

Referring to FIGS. 9 and 10, a semiconductor package 100A according to the present exemplary embodiment may include a support member 110 having a cavity 110H penetrating through first and second surfaces 110A and 110B opposing each other, a semiconductor chip 120 disposed in the cavity 110H of the support member 110 and having an active surface having connection pads 122 disposed thereon and a surface opposing the active surface, an encapsulant 130 encapsulating the support member 110 and the semiconductor chip 120, and a connection member 140 disposed on the support member 110 and the active surface of the semiconductor chip 120.

The support member 110 used in the present exemplary embodiment may include a first dielectric layer 111a and second and third dielectric layers 111b and 111c disposed on opposite surfaces of the first dielectric layer 111a, respectively. In addition, the support member 110 may include a wiring structure connecting the first and second surfaces 110A and 110B to each other.

In detail, the wiring structure of the support member 110 may include first and second wiring patterns 112a and 112b disposed on opposite surfaces of the first dielectric layer 111a, respectively, third wiring patterns 112c disposed on the second dielectric layer 111b, fourth wiring patterns 112d disposed on the third dielectric layer 111c, first vias 113a penetrating through the first dielectric layer 111a and connecting the first and second wiring patterns 112a and 112b to each other, second vias 113b penetrating through the second dielectric layer 111b and connecting the first and third wiring patterns 112a and 112c to each other, and third vias 113c penetrating through the third dielectric layer 111c and connecting the second and fourth wiring patterns 112a and 112c to each other. The wiring structure used in the present exemplary embodiment may provide through-vias including the first to third vias connecting the second and fourth wiring patterns disposed on the first and second surfaces 110A and 110B of the support member 110, respectively, to each other, but may be variously modified depending on the number of dielectric layers. Since the support member 110 may include a large number of wiring patterns 112a, 112b, 112c, and 112d, the connection member 140 may further be simplified. Therefore, a decrease in a yield depending on a defect occurring in a process of forming the connection member 140 may be suppressed.

The connection member 140 used in the present exemplary embodiment may include a first insulating layer 141a disposed on the second surface 110B of the support member 110 and the active surface of the semiconductor chip 120, a first redistribution layer 142a disposed on the first insulating layer 141a, first vias 143a penetrating through the first insulating layer 141a and connecting the first redistribution layer 142a and the connection pads 122 of the semiconductor chip 122 to each other, a second insulating layer 141b disposed on the first insulating layer 141a and covering the first redistribution layer 142a, a second redistribution layer 142b disposed on the second insulating layer 141b, second vias 143b penetrating through the second insulating layer 141b and connecting the first and second redistribution layers 142a and 142b to each other, a third insulating layer 141c disposed on the second insulating layer 141b and covering the second redistribution layer 142b, a third redistribution layer 142c disposed on the third insulating layer 141c, and third vias 143c penetrating through the third insulating layer 141c and electrically connecting the second and third redistribution layers 142b and 142c to each other. As described above, a form in which the connection member has a three-layer redistribution structure including the first redistribution layer 142a, the second redistribution layer 142b, and the third redistribution layer 142c is illustrated. However, the connection member is not limited thereto, but may be implemented in a structure including a single redistribution layer or four or more redistribution layers. In the present specification, an "upper surface" of each of the first to third redistribution layers 142a, 142b, and 142c refers to a surface thereof opposing a surface thereof in contact with the insulating layer on which a corresponding redistribution layer is formed regardless of a disposition direction of the semiconductor package 100A, and refers to a surface thereof applied by another insulating layer.

In the present exemplary embodiment, the fourth wiring patterns 112d may be provided on the second surface 110B of the support member 110 in a protruding form, and the first insulating layer 141a may be formed on the second surface 110B of the support member 110. Since the fourth wiring patterns 112d are formed by a printed circuit board process, the fourth wiring patterns 112d may have a thickness relatively greater than that of the redistribution layer of the connection member, and it may be difficult to secure flatness of the first insulating layer.

Conventionally, a thickness of each of the fourth wiring patterns 112d of the support member 110 is decreased by chemical mechanical polishing (CMP) or an etchback process before the connection member is formed. On the other hand, the present disclosure may provide a method of forming the first insulating layer 141a using double coating without using such a complicated process.

As illustrated in FIG. 9, the first insulating layer 141a may include a first insulating coating 141a' covering the fourth wiring patterns 112d and a second insulating coating 141a" disposed on the first insulating coating 141a'. The second insulating coating 141a" may have a higher level of flatness than that of the first insulating coating 141a'.

The first insulating coating 141a' may have convex structures in the vicinity of the fourth wiring patterns 112d due to tension between the first insulating coating 141a' and surfaces of the fourth wiring patterns 112d formed of copper before it is hardened, resulting in a large thickness deviation (that is, a low level of flatness). On the other hand, the second insulating coating 141a" applied after the first insulating coating 141a' is hardened may be formed on a surface of the first insulating coating 141a' to significantly alleviate a step. Such a process will be described below with reference to FIGS. 11A to 11D.

Since the first and second insulating coatings 141a' and 141a" improve flatness using a state of a surface to which they are applied, the first and second insulating coatings 141a' and 141a" are not limited to being formed of different materials, but may be formed of the same material for convenience of a process. For example, the first and second insulating coatings 141a' and 141a" may include a photoimagable dielectric (PID) resin. Even though the first and second insulating coatings 141a' and 141a" constituting the first insulating layer 141a are formed of the same material as described above, first and second insulating coatings 141a' and 141a" are hardened at different points in time, and an interface between the first and second insulating coatings 141a' and 141a" may thus be observed by an optical microscope.

In the present exemplary embodiment, the first insulating layer 141a is used to cover relatively thick patterns, and may thus have a thickness greater than those of the second and third insulating layers 141b and 141c.

In the present exemplary embodiment, a passivation layer 150 may be disposed on the connection member 140, and underbump metal layers 160 may be disposed in openings 151 of the passivation layer 150. In addition, electrical connection structures 170 connected to the underbump metal layers 160 may be disposed on the passivation layer 150.

The respective components included in the semiconductor package 100A according to the present exemplary embodiment will hereinafter be described in more detail.

The support member 110 may maintain rigidity of the semiconductor package 100A, and serve to secure uniformity of a thickness of the encapsulant 130. A wiring structure may not be introduced into the support member 110 (see FIG. 12), and another type of wiring structure may be introduced. The semiconductor chip 120 may be disposed in the cavity 110H to be spaced apart from sidewalls of the support member 110 by a predetermined distance. Side surfaces of the semiconductor chip 120 may be surrounded by the support member 110. However, such a form is only an example and may be variously modified to have other forms, and the support member 110 may perform another function depending on such a form. In some exemplary embodiments, the support member 110 may be omitted.

The support member 110 may include various dielectric layers. A material of the dielectric layer may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fabric, for example, prepreg, Ajinomoto Build up Film (ABF), FR-4, Bismaleimide Triazine (BT), or the like. When a material having high rigidity, such as prepreg including a glass fabric, or the like, is used as the material of the dielectric layer, the support member 110 may be utilized as a support member for controlling warpage of the semiconductor package 100A.

The semiconductor chip 120 may be an integrated circuit (IC) provided in an amount of several hundred to several million or more elements integrated in a single chip. In this case, the IC may be, for example, a processor chip (more specifically, an application processor (AP)) such as a central processor (for example, a CPU), a graphic processor (for example, a GPU), a field programmable gate array (FPGA), a digital signal processor, a cryptographic processor, a micro processor, a micro controller, or the like, but is not limited thereto. That is, the IC may be a logic chip such as an analog-to-digital converter, an application-specific IC (ASIC), or the like, or a memory chip such as a volatile memory (for example, a DRAM), a non-volatile memory (for example, a ROM), a flash memory, or the like. In addition, the abovementioned elements may also be combined with each other and be disposed.

The semiconductor chip 120 may be formed on the basis of an active wafer. In this case, a base material of a body 121 of the semiconductor chip 120 may be silicon (Si), germanium (Ge), gallium arsenide (GaAs), or the like. Various circuits may be formed on the body 121. The connection pads 122 may electrically connect the semiconductor chip 120 to other components. A material of each of the connection pads 122 may be a conductive material such as aluminum (Al), or the like. A passivation layer 123 exposing the connection pads 122 may be formed on the body 121, and may be an oxide film, a nitride film, or the like, or a double layer of an oxide layer and a nitride layer. A lower surface of the connection pad 122 may have a step with respect to a lower surface of the encapsulant 130 through the passivation layer 123. Resultantly, a phenomenon in which the encapsulant 130 bleeds into the lower surface of the connection pads 122 may be prevented to some extent. An insulating layer (not illustrated), and the like, may also be further disposed in other required positions. The semiconductor chip 120 may be a bare die, a redistribution layer (not illustrated) may further be formed on the active surface of the semiconductor chip 120, if necessary, and bumps (not illustrated), or the like, may be connected to the connection pads 122.

The encapsulant 130 may be provided in order to protect the support member 110 and an electronic component such as the semiconductor chip 120, and the like. An encapsulation form of the encapsulant 130 is not particularly limited, but may be a form in which the encapsulant 130 surrounds at least portions of the support member 110, the semiconductor chip 120, and the like. For example, the encapsulant 130 may cover an upper surface of the support member 110 and the semiconductor chip 120, and fill spaces between sidewalls of the cavity 110H and the side surfaces of the semiconductor chip 120. In addition, the encapsulant 130 may also fill at least a portion of a space between the passivation layer 123 of the semiconductor chip 120 and the connection member 140. Meanwhile, the encapsulant 130 may fill the cavity 110H to thus serve as an adhesive and reduce buckling of the semiconductor chip 120 depending on certain materials.

For example, a thermosetting resin such as an epoxy resin, a thermoplastic resin such as a polyimide resin, a resin in which the thermosetting resin and the thermoplastic resin are mixed with an inorganic filler or are impregnated together with an inorganic filler in a core material such as a glass fiber, or the like, for example, prepreg, ABF, FR-4, BT, or the like, may be used as a material of the encapsulant 130. In some exemplary embodiments, a PID resin may also be used as the material of the encapsulant 130.

The connection member 140 may redistribute the connection pads 122 of the semiconductor chip 120. Several tens to several hundreds of connection pads 122 of the semiconductor chip 120 having various functions may be redistributed by the connection member 140, and may be physically or electrically externally connected through the electrical connection structures 170 depending on the functions.

The first to third insulating layers 141a, 141b, and 141c used in the connection member 140 may be formed of a photosensitive insulating material such as a PID resin, in addition to the insulating material described above. In the present exemplary embodiment, each of the first to third insulating layers 141a, 141b, and 141c may be formed of a PID resin. When the first to third insulating layers 141a, 141b, and 141c have photosensitive properties, the first to third insulating layers 141a, 141b, and 141c may be formed to have a smaller thickness, and fine pitches of the first to third vias 143a, 143b, and 143c may be achieved more easily. The first to third insulating layers 141a, 141b, and 141c may be photosensitive insulating layers including an insulating resin and an inorganic filler. When the first to third insulating layers 141a, 141b, and 141c are multiple layers, materials of the first to third insulating layers 141a, 141b, and 141c may be the same as each other, and may also be different from each other, if necessary. When the first to third insulating layers 141a, 141b, and 141c are the multiple layers, the first to third insulating layers 141a, 141b, and 141c may be integrated with one another depending on a process, such that boundaries thereamong may also not be apparent. A thickness of each of the first to third insulating layers 141a, 141b, and 141c between patterns except for the first to third redistribution layers 142a, 142b, and 142c may be approximately 1 μm to 10 μm.

The first to third redistribution layers 142a, 142b, and 142c may serve to redistribute the connection pads 122 together with the first to third vias 143a, 143b, and 143c. Each of the first to third redistribution layers 142a, 142b, and 142c may include a conductive material such as copper (Cu), aluminum (Al), silver (Ag), tin (Sn), gold (Au), nickel (Ni), lead (Pb), titanium (Ti), or alloys thereof. The first to third redistribution layers 142a, 142b, and 142c may perform various functions depending on designs of corresponding layers. For example, the first to third redistribution layers 142a, 142b, and 142c may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the first to third redistribution layers 142a, 142b, and 142c may include via pad patterns, electrical connection structure pad patterns, and the like. Each of the first to third redistribution layers 142a, 142b, and 142c may have a thickness of about 0.5 μm to 15 μm.

The first to third vias 143a, 143b, and 143c may serve to connect (interlayer connection) the first to third redistribution layers 142a, 142b, and 142c, the connection pads 122, and the like, formed on different layers to each other in a vertical direction. Each of the first to third vias 143a, 143b, and 143c may include a conductive material such as copper (Cu), aluminum (Al), silver (Ag), tin (Sn), gold (Au), nickel (Ni), lead (Pb), titanium (Ti), or alloys thereof. Each of the first to third vias 143a, 143b, and 143c may be completely filled with the conductive material, or the conductive material may also be formed along a wall of each of via holes. In addition, each of the first to third vias 143a, 143b, and 143c may have any shape known in the related art, such as a tapered shape, a cylindrical shape, and the like.

The passivation layer 150 may protect the connection member 140 from external physical or chemical damage. The passivation layer 150 may have the openings 151 exposing at least portions of the first to third redistribution layers 142a, 142b, and 142c of the connection member 140. The number of openings 151 formed in the passivation layer 150 may be several tens to several thousands. A material of the passivation layer 150 is not particularly limited, but may be the insulating material described above. For example, the passivation layer 150 may include at least one of prepreg, AFB, FR-4, and a solder resist.

The underbump metal layers 160 may improve connection reliability of the electrical connection structures 170 to improve board level reliability of the semiconductor package 100A. The underbump metal layers 160 may be connected to the redistribution layer 142 of the connection member 140 exposed through the openings 151 of the passivation layer 150. The underbump metal layers 160 may be formed in the openings 151 of the passivation layer 150 by any known metallization method using any known conductive metal such as a metal, but are not limited thereto.

The electrical connection structure 170 may physically or electrically externally connect the semiconductor package 100A. For example, the semiconductor package 100A may be mounted on the mainboard of the electronic device through the electrical connection structures 170. Each of the electrical connection structures 170 may be formed of a conductive material, for example, a low melting point metal, or the like. However, this is only an example, and a material of each of the electrical connection structures 170 is not particularly limited thereto. Each of the electrical connection structures 170 may be a land, a ball, a pin, or the like. The electrical connection structures 170 may be formed as a multilayer or single layer structure. When the electrical connection structures 170 are formed as a multilayer structure, the electrical connection structures 170 may include a copper (Cu) pillar and a low melting point metal. When the electrical connection structures 170 are formed as a single layer structure, the electrical connection structures 170 may include copper (Cu) or a low melting point alloy such as an Sn—Al—Cu alloy. However, this is only an example, and the electrical connection structures 170 are not limited thereto. The number, an interval, a disposition form, and the like, of electrical connection structures 170 are not particularly limited, but may be sufficiently modified depending on design particulars by those skilled in the art. For example, the electrical connection structures 170 may be provided in an amount of several tens to several thousands according to the number of connection pads 122, or may be provided in an amount of several tens to several thousands or more or several tens to several thousands or less.

When the electrical connection structures 170 are low melting point balls, the electrical connection structures 170 may cover side surfaces of the underbump metal layers 160 extending onto one surface of the passivation layer 150, and connection reliability may be more excellent.

At least one of the electrical connection structures 170 may be disposed in a fan-out region. The fan-out region refers to a region except for a region in which the semiconductor chip 120 is disposed. The fan-out package may have excellent reliability as compared to a fan-in package, may implement a plurality of input/output (I/O) terminals, and may facilitate a 3D interconnection. In addition, as compared to a ball grid array (BGA) package, a land grid array (LGA) package, or the like, the fan-out package may be manufactured to have a small thickness.

Meanwhile, although not illustrated in the drawings, a metal thin film may be formed on walls of the cavity 110H, if necessary, in order to dissipate heat or block electromagnetic waves. In some exemplary embodiments, a plurality of semiconductor chips 120 performing functions that are the same as or different from each other may be disposed in the cavity 110H, if necessary. In some exemplary embodiments, a separate passive component such as an inductor, a capacitor, or the like, may be disposed in the cavity 110H. In some exemplary embodiments, a passive component, for example, a surface mounting technology (SMT) component including an inductor, a capacitor, or the like, may be disposed on a surface of the passivation layer 150.

In the semiconductor package according to the exemplary embodiment described above, the first and second insulating coatings may be sequentially applied and hardened as the insulating layer covering the wiring patterns of the support member to improve flatness.

FIGS. 11A through 11D are cross-sectional views for describing main processes of forming a redistribution layer according to an exemplary embodiment in the present disclosure. FIGS. 11A through 11D illustrate a series of processes corresponding to an enlarged portion of FIG. 9.

Figure 11A:
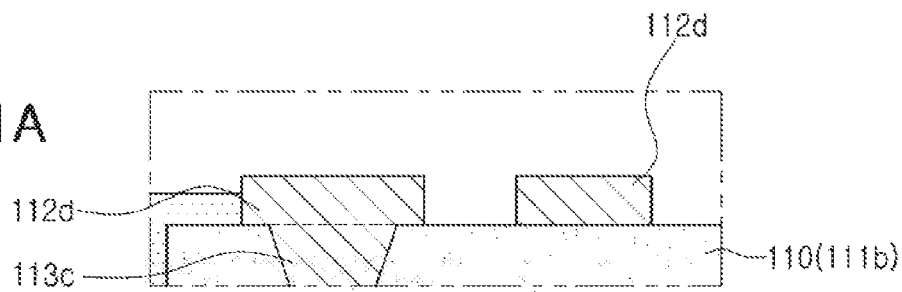
FIGS. 11A through 11D are cross-sectional views for describing main processes of forming a redistribution layer according to an exemplary embodiment in the present disclosure.

Referring to FIG. 11A, two fourth wiring patterns may be disposed on the support member 110 in a protruding form.

As described above, the fourth wiring patterns 112d are formed by the printed circuit board process, and may thus have a relatively great thickness (for example, 10 μm or more) Therefore, in order to secure flatness by the first insulating layer 141a, the thickness of each of the fourth wiring patterns 112d is decreased by the CMP or the etchback process before the connection member is formed. On the other hand, in the present exemplary embodiment, the double coating may be used.

Figure 11B:
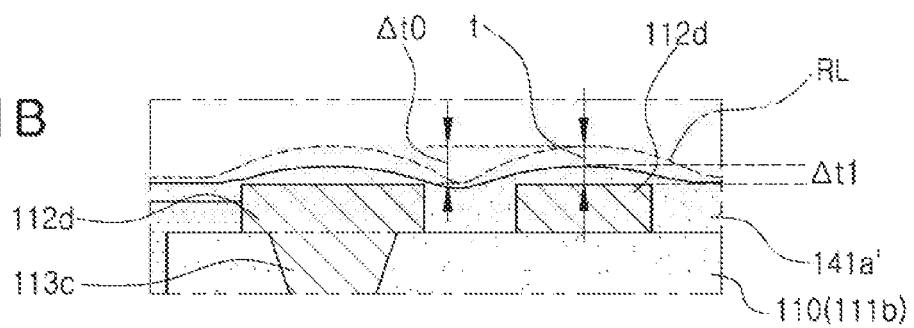

Then, as illustrated in FIG. 11B, the first insulating coating 141a' may be formed to cover the fourth wiring patterns 112d disposed on the support member 110.

For example, the first insulating coating 141a' may include the PID resin. The first insulating coating 141a' formed in the present process may have the convex structures in the vicinity of the fourth wiring patterns 112d due to the tension between the first insulating coating 141a' and the surfaces of the fourth wiring patterns 112d formed of copper, resulting in a large thickness deviation.

Since a thickness t of an insulating layer disposed on the fourth wiring patterns 112d needs to be sufficiently secured (see dotted lines RL) in order to sufficiently insulate interlayer circuits from each other, when the first insulating layer 141a for the redistribution layer is formed by applying coating only once, a large thickness deviation $\Delta t0$ may be inevitably generated in order to obtain a desired thickness t of the insulating layer. In order to prevent this, in the present process, the first insulating coating 141a' may be formed at a thickness enough to cover the fourth wiring patterns 112d formed of copper, but as small as possible, as a portion of the first insulating layer 141a. The first insulating coating 141a' may have a thickness deviation Δt1 smaller than an existing thickness deviation Δt0. For example, the thickness deviation Δt1 of the first insulating coating 141a' may be in a range of 10 to 13 μm. In addition, a minimum thickness of a portion of the first insulating coating 141a' disposed between the fourth wiring patterns 112d may be smaller than that of each of the fourth wiring patterns.

Figure 11C:
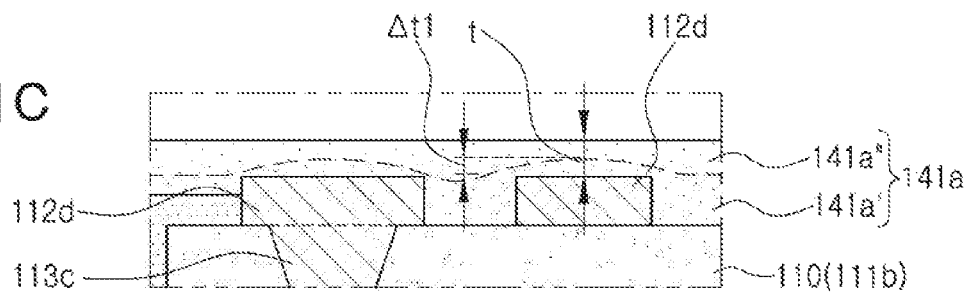

Then, as illustrated in FIG. 11C, the second insulating coating 141a" may be formed on the first insulating coating 141a' after the first insulating coating 141a' is hardened.

The second insulating coating 141a" may be formed so that the desired thickness t of the insulating layer is secured together with the first insulating coating 141a'. That is, the desired thickness t of the insulating layer may be implemented by the sum of a thickness of the first insulating coating 141a' and a thickness of the second insulating coating 141a" on the fourth wiring pattern 112d. Since the second insulating coating 141a" is formed on the first insulating coating 141a' formed of a material similar to that of the second insulating coating 141a", the second insulating coating 141a" may be relatively flatly formed.

In the present process, a thickness deviation of the second insulating coating 141a" may be alleviated as compared to the thickness deviation of the first insulating coating 141a'. For example, the thickness deviation of the second insulating coating 141a" may have a significantly high level of flatness of 3 μm or less.

The second insulating coating 141a" may include the PID resin. As described above, even though the second insulating coating 141a" is formed of the same material as that of the first insulating coating 141a', the first and second insulating coatings 141a' and 141a" are hardened at different points in time, and the interface between the first and second insulating coatings 141a' and 141a" may thus be observed.

Figure 11D:
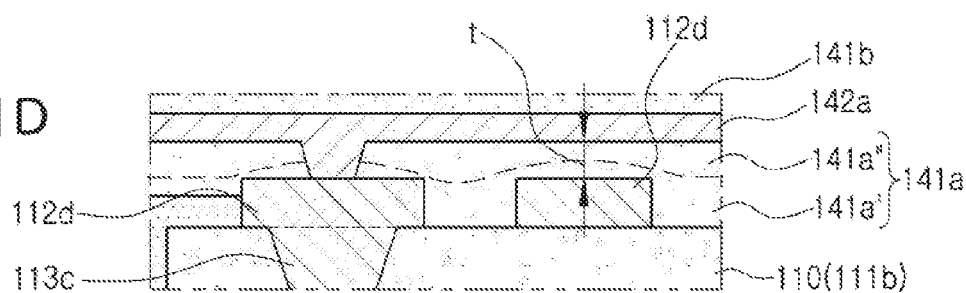

Then, as illustrated in FIG. 11D, the first redistribution layer 142a and the first via 143a may be formed on and in the second insulating coating 141a", that is, on and in the first insulating layer 141a.

Since the first insulating layer 141a provides a planarized surface in spite of a step of the fourth wiring patterns 112d, a short-circuit of the interlayer circuit may be prevented, and the first redistribution layer 142a may be effectively formed.

Figure 12:
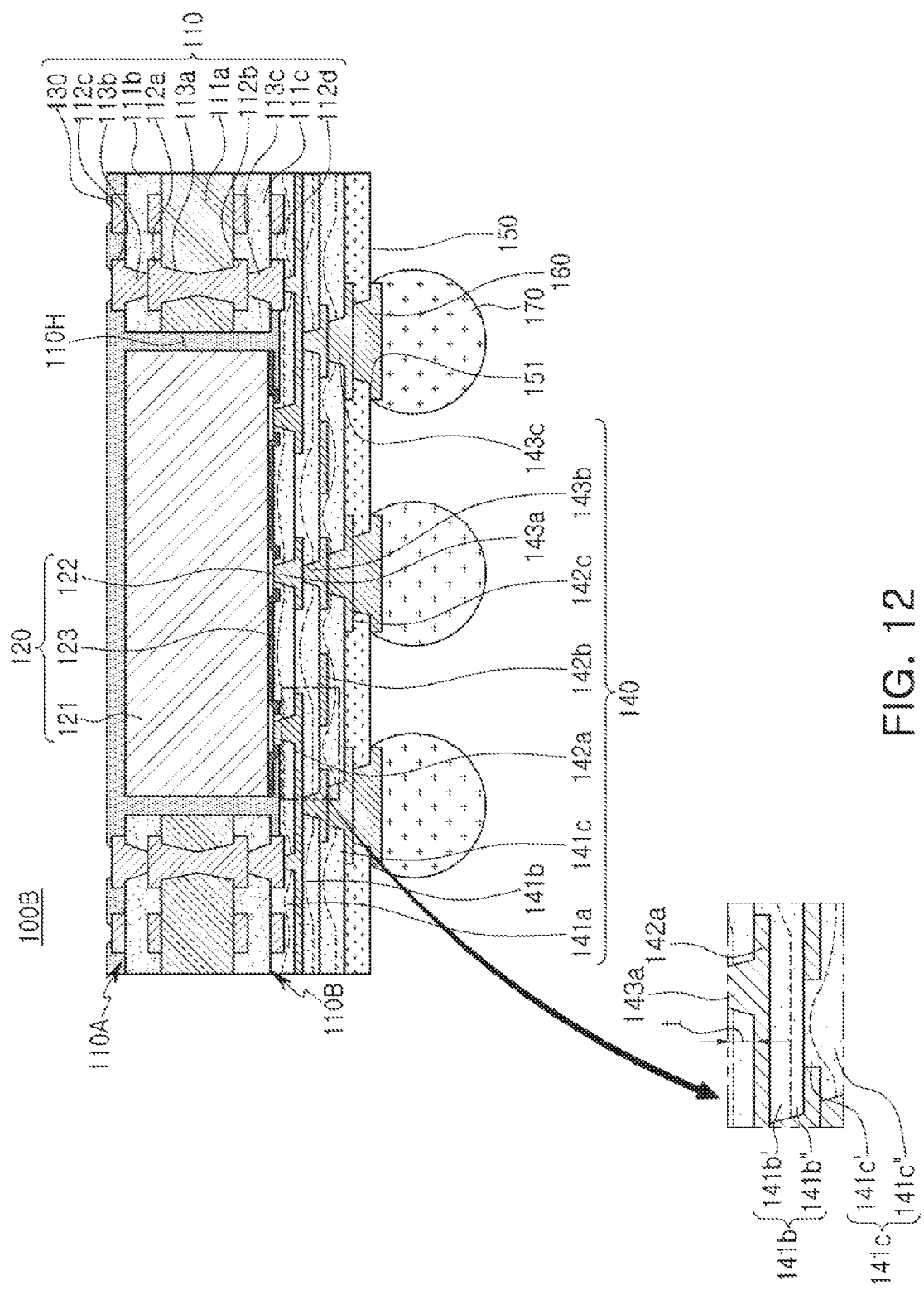
FIG. 12 is a side cross-sectional view illustrating a semiconductor package according to another exemplary embodiment in the present disclosure.

FIG. 12 is a side cross-sectional view illustrating a semiconductor package according to another exemplary embodiment in the present disclosure.

Referring to FIG. 12, it may be understood that a semiconductor package 100B according to the present exemplary embodiment has a structure similar to that illustrated in FIGS. 9 and 10 except that second and third insulating layers 141b and 141c of a connection member 140 are formed in a double coating manner, similar to a first insulating layer 141a of the connection member 140. Components according to the present exemplary embodiment may be understood with reference to the description for the same or similar components of the semiconductor package 100A illustrated in FIGS. 9 and 10 unless explicitly described to the contrary.

In the present exemplary embodiment, the second and third insulating layers 141b and 141c of the connection member 140 may be formed in the double coating manner, as described above. The second insulating layer 141b may include a first insulating coating 141b' disposed on the first insulating layer 141a and covering the first redistribution layer 142a and a second insulating coating 141b" disposed on the first insulating coating 141b' and having a higher level of flatness than that of the first insulating coating 141b'. Similarly, the third insulating layer 141c may include first and second insulating coatings 141c' and 141c" formed in the double coating manner to improve flatness. The first insulating coatings 141b' and 141c' and the second insulating coatings 141b" and 141c" may include the same PID resin.

In this way, flat insulating layers that may sufficiently secure insulation between interlayer circuits without significantly increasing thicknesses of the respective insulating layers 141a, 141b, and 141c may be provided. As described above, the connection member 140 of the semiconductor package 100A illustrated in FIG. 9 is implemented, similar to the insulating layers of the connection member 140, such that the respective insulating layers on which the redistribution layers are implemented may be formed to have an excellent level of flatness in the double coating manner.

Figure 13:
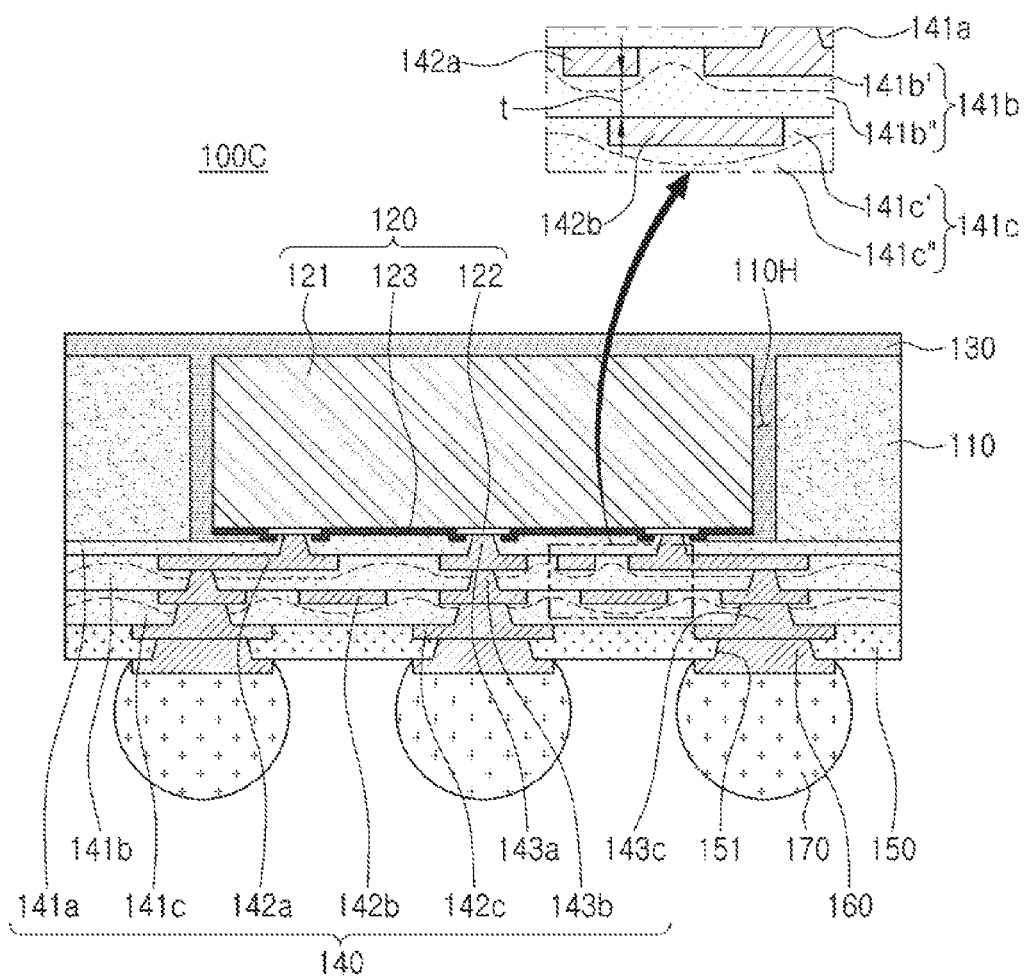
FIG. 13 is a side cross-sectional view illustrating a semiconductor package according to another exemplary embodiment in the present disclosure.

FIG. 13 is a side cross-sectional view illustrating a semiconductor package according to another exemplary embodiment in the present disclosure.

Referring to FIG. 13, it may be understood that a semiconductor package 100C according to the present exemplary embodiment has a structure similar to that illustrated in FIGS. 9 and 10 except that a support member 110 that does not have a wiring structure is used and second and third insulating layers 141b and 141c of a connection member 140 are formed in a double coating manner. Components according to the present exemplary embodiment may be understood with reference to the description for the same or similar components of the semiconductor package 100A illustrated in FIGS. 9 and 10 unless explicitly described to the contrary.

In the present exemplary embodiment, a first insulating layer 141a of the connection member 140 may be formed in a single layer structure, and the second and third insulating layers 141b and 141c of the connection member 140 may be formed in the double coating manner. The second insulating layer 141b may include a first insulating coating 141b' disposed on the first insulating layer 141a and covering the first redistribution layer 142a and a second insulating coating 141b" disposed on the first insulating coating 141b' and having a higher level of flatness than that of the first insulating coating 141b'. Similarly, the third insulating layer 141c may include first and second insulating coatings 141c' and 141c" formed in the double coating manner, similar to the second insulating layer 141b, to improve flatness. The first insulating coatings 141b' and 141c' and the second insulating coatings 141b" and 141c" may include the same PID resin.

In the present exemplary embodiment, a form in which the first insulating layer 141a is not formed in the double coating manner since protruding or concave wiring patterns are not used on a surface of a support member is illustrated, the first insulating layer 141a may also be formed in the double coating manner as in the semiconductor package 100B illustrated in FIG. 12. For example, the first insulating layer 141a may include a first insulating coating and a second insulating coating as in the second and third insulating layers 141b and 141c described above. Here, the first insulating coating of the first insulating layer 141a may cover a support member 110 and an active surface of a semiconductor chip 120. When a bent portion exists in a region (for example, a region of an encapsulant 130) between the support member 110 and the semiconductor chip 120, the first insulating coating may contribute to planarizing the bent portion.

Figure 14:
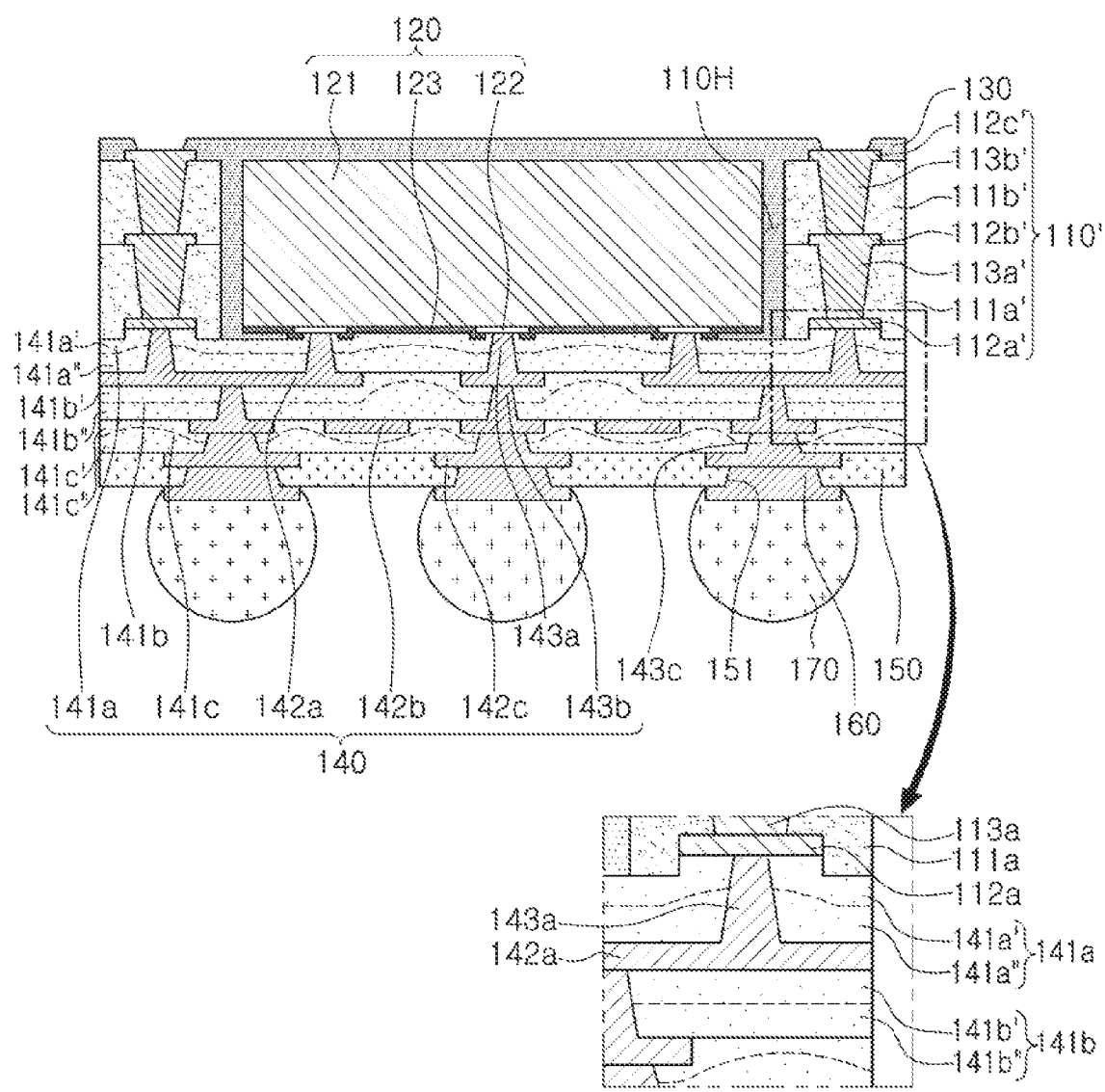
FIG. 14 is a side cross-sectional view illustrating a semiconductor package according to another exemplary embodiment in the present disclosure.

FIG. 14 is a side cross-sectional view illustrating a semiconductor package according to another exemplary embodiment in the present disclosure.

Referring to FIG. 14, it may be understood that a semiconductor package 100D according to the present exemplary embodiment has a structure similar to that illustrated in FIGS. 9 and 10 except that a support member 110' different from that of the exemplary embodiment described above is used and second and third insulating layers 141b and 141c of a connection member 140 are additionally formed in a double coating manner. Components according to the present exemplary embodiment may be understood with reference to the description for the same or similar components of the semiconductor package 100A illustrated in FIGS. 9 and 10 unless explicitly described to the contrary.

In the present exemplary embodiment, the support member 110' may include a first dielectric layer 111a' in contact with a connection member 140, first wiring patterns 112a' in contact with the connection member 140 and embedded in the first dielectric layer 111a', second wiring patterns 112b' disposed on the other surface of the first dielectric layer 111a' opposing one surface of the first dielectric layer 111a' in which the first wiring patterns 112a' are embedded, a second dielectric layer 111b' disposed on the first dielectric layer 111a' and covering the second wiring patterns 112b', and third wiring patterns 112c' disposed on the second dielectric layer 111b'. The first to third wiring patterns 112a', 112b', and 112c' may be electrically connected to connection pads 122. The first and second wiring patterns 112a' and 112b' and the second and third wiring patterns 112b' and 112c' may be electrically connected to each other through first and second vias 113a' and 113b' penetrating through the first and second dielectric layers 111a' and 111b', respectively.

In the present exemplary embodiment, since the first wiring patterns 112a' are embedded in the first dielectric layer 111a', a step generated due to a thickness of the first wiring patterns 112a' may be decreased, and a deviation of an insulating distance of the connection member 140 may be decreased. In addition, a difference between a distance from a first redistribution layer 142a of the connection member 140 to a lower surface of the first dielectric layer 111a' and a distance from the first redistribution layer 142a of the connection member 140 to the connection pad 122 of a semiconductor chip 120 may be smaller than a thickness of the first wiring pattern 112a'. Therefore, a high density wiring design of the connection member 140 may be easy.

Meanwhile, the first wiring patterns 112a' may be somewhat concavely disposed in a lower surface of the support member 110'. A first insulating layer 141a used in the present exemplary embodiment may be provided in a double coating manner to remove a step due to a concave structure. In detail, the first insulating layer 141a may include a first insulating coating 141a' disposed on the lower surface of the support member 110' and a second insulating coating 141a" disposed on the first insulating coating 141a' and having a higher level of flatness than that of the first insulating coating 141a'. The first insulating layer 141a provided in the double coating manner described above may extend to an active surface of the semiconductor chip 120 to alleviate a non-uniform step between the semiconductor chip 120 and the support member 110'.

In the present exemplary embodiment, a second insulating layer 141b and a third insulating layer 141c of the connection member 140 may be formed in a double coating manner in order to planarize thickness deviations due to first and second redistribution layers 142a and 142b as in another exemplary embodiment described above (see FIGS. 12 and 13).

As set forth above, according to the exemplary embodiments in the present disclosure, a semiconductor package in which an insulating layer disposed on patterns (particularly, wiring patterns protruding from a support member) are formed by double coating to improve final flatness of the insulating layer in a desired thickness range and a short-circuit between the insulating layer and a redistribution layer formed in a subsequent process is reduced may be provided.

Particularly, an insulating layer having a desired level of flatness may be formed by only double coating technology without decreasing a thickness of the wiring patterns protruding from the support member by an additional polishing process or an etchback process.

While exemplary embodiments have been shown and described above, it will be apparent to those skilled in the art that modifications and variations could be made without departing from the scope of the present invention as defined by the appended claims.

What is claimed is:

1. A semiconductor package comprising:
   a support member having first and second surfaces opposing each other, having a cavity penetrating through the first and second surfaces, and including a wiring structure;
   a semiconductor chip disposed in the cavity and having an active surface having connection pads disposed thereon;
   a connection member including a first insulating layer disposed on the second surface of the support member, a first redistribution layer on the first insulating layer, and a plurality of first vias penetrating through the first insulating layer and connecting the wiring structure and the connection pads to the first redistribution layer; and
   an encapsulant encapsulating the semiconductor chip disposed in the cavity and covering the first surface of the support member,
   wherein the wiring structure includes wiring patterns disposed on the second surface of the support member, each of the wiring patterns having a thickness greater than that of the first redistribution layer;
   the first insulating layer includes a first insulating coating disposed on the second surface of the support member and covering the wiring patterns and a second insulating coating disposed on the first insulating coating and having a higher level of flatness than that of the first insulating coating, and
   the first insulating coating is interposed between the second insulating coating and the wiring structure.

2. The semiconductor package of claim 1, wherein the first and second insulating coatings are formed of the same material.

3. A semiconductor package comprising:
   a support member having first and second surfaces opposing each other, having a cavity penetrating through the first and second surfaces, and including a wiring structure;
   a semiconductor chip disposed in the cavity and having an active surface having connection pads disposed thereon;
   a connection member including a first insulating layer disposed on the second surface of the support member, a first redistribution layer on the first insulating layer, and a plurality of first vias penetrating through the first insulating layer and connecting the wiring structure and the connection pads to the first redistribution layer; and an encapsulant encapsulating the semiconductor chip disposed in the cavity and covering the first surface of the support member, wherein the wiring structure includes wiring patterns disposed on the second surface of the support member, each of the wiring patterns having a thickness greater than that of the first redistribution layer, the first insulating layer includes a first insulating coating disposed on the second surface of the support member and covering the wiring patterns and a second insulating coating disposed on the first insulating coating and having a higher level of flatness than that of the first insulating coating, and each of the first and second insulating coatings includes a photoimagable dielectric (PID) resin.

4. The semiconductor package of claim 1, wherein the wiring patterns disposed on the second surface of the support member are protruding wiring patterns, and a minimum thickness of a portion of the first insulating coating disposed between the wiring patterns is smaller than that of the wiring patterns.

5. The semiconductor package of claim 1, wherein the wiring structure includes additional wiring patterns disposed on the first surface of the support member and through-vias penetrating through the first and second surfaces of the support member and connecting the wiring patterns and the additional wiring patterns to each other.

6. The semiconductor package of claim 1, wherein the connection member further includes a second insulating layer disposed on the first redistribution layer, a second redistribution layer disposed on the second insulating layer, and a plurality of second vias penetrating through the second insulating layer and connecting the first redistribution layer and the second redistribution layer to each other.

7. The semiconductor package of claim 6, wherein the first insulating layer has a thickness greater than that of the second insulating layer.

8. The semiconductor package of claim 6, wherein the second insulating layer includes a third insulating coating disposed on the first insulating layer and covering the first redistribution layer and a fourth insulating coating disposed on the third insulating coating and having a higher level of flatness than that of the third insulating coating.

9. The semiconductor package of claim 1, further comprising a passivation layer disposed on the connection member, underbump metal layers penetrating through the passivation layer and connected to the first redistribution layer, and electrical connection structures disposed on the underbump metal layers.

10. The semiconductor package of claim 1, wherein the wiring patterns protrude from or are concavely disposed on the second surface of the support member.

11. The semiconductor package of claim 1, wherein the first and second insulating coatings are formed of different materials.

* * * * *